US009335347B2

(12) United States Patent
Andberg et al.

(10) Patent No.: US 9,335,347 B2
(45) Date of Patent: May 10, 2016

(54) METHOD AND APPARATUS FOR MASSIVELY PARALLEL MULTI-WAFER TEST

(75) Inventors: John W. Andberg, Santa Cruz, CA (US); Ira H. Leventhal, San Jose, CA (US); Matthew W. Losey, Livermore, CA (US); Yohannes Desta, Arcadia, CA (US); Lakshmikanth Namburi, Arcadia, CA (US); Vincent E. Lopopolo, San Jose, CA (US); Sanjeev Grover, Campbell, CA (US); Erik Volkerink, Palo Alto, CA (US)

(73) Assignee: ADVANTEST CORPORATION, Tokyo (JP)

( * ) Notice: Subject to any disclaimer, the term of this patent is extended or adjusted under 35 U.S.C. 154(b) by 286 days.

(21) Appl. No.: 13/609,154

(22) Filed: Sep. 10, 2012

(65) Prior Publication Data

US 2014/0070828 A1    Mar. 13, 2014

(51) Int. Cl.
*G01R 31/28* (2006.01)
*G01R 1/04* (2006.01)
*G01R 1/073* (2006.01)
*G01R 35/00* (2006.01)

(52) U.S. Cl.
CPC .............. *G01R 1/073* (2013.01); *G01R 1/0408* (2013.01); *G01R 31/2891* (2013.01); *G01R 31/2893* (2013.01); *G01R 35/005* (2013.01)

(58) Field of Classification Search
CPC ........ G01R 31/00; G01R 31/02; G01R 31/28; G01R 1/06; G01R 31/2893; G01R 31/307; G01R 1/0408; G01R 1/073; G01R 31/2886; G01R 31/2887; G01R 1/0491; G01R 31/2863; G01R 31/2867; G01R 35/005; G05B 19/4189; G05B 2219/32197; G05B 2219/45056; H01L 21/67766; H01L 21/67775; H01L 21/67778; H01L 21/68707; H01L 21/68; H01L 21/67259
USPC ........ 324/750.19, 750.02, 750.25, 72.5, 73.1, 324/158 P, 158 F, 458, 537, 690, 731, 754, 324/755, 756, 760, 765, 754.08, 71.1, 324/750.16, 756.01, 756.03, 757.03, 324/762.05, 754.07; 438/5, 11, 14
See application file for complete search history.

(56) References Cited

U.S. PATENT DOCUMENTS

| | | | |
|---|---|---|---|
| 5,570,032 A | 10/1996 | Atkins et al. | |
| 6,053,688 A * | 4/2000 | Cheng | 414/416.03 |
| 7,148,716 B2 * | 12/2006 | Schuette et al. | 324/754.03 |
| 7,648,327 B2 * | 1/2010 | Bonora et al. | 414/744.3 |
| 7,741,837 B2 * | 6/2010 | Obikane et al. | 324/754.08 |
| 2007/0285115 A1 | 12/2007 | Wood et al. | |
| 2011/0156735 A1 * | 6/2011 | Breinlinger et al. | 324/750.19 |

FOREIGN PATENT DOCUMENTS

| | | |
|---|---|---|
| KR | 10-2009-0130586 | 12/2009 |
| KR | 10-2010-0085877 | 7/2010 |

* cited by examiner

*Primary Examiner* — Tung X Nguyen
*Assistant Examiner* — Neel Shah (57) ABSTRACT

Disclosed herein is a cost effective, efficient, massively parallel multi-wafer test cell. Additionally, this test cell can be used for both single-touchdown and multiple-touchdown applications. The invention uses a novel "split-cartridge" design, combined with a method for aligning wafers when they are separated from the probe card assembly, to create a cost effective, efficient multi-wafer test cell. A "probe-card stops" design may be used within the cartridge to simplify the overall cartridge design and operation.

13 Claims, 10 Drawing Sheets

300 — One or more FOUP's of wafers are inserted into the handler at the FOUP Load Ports.

305 — Robotics in the handler remove a wafer from a FOUP and load it onto a cartridge bottom section.

310 — The cartridge bottom section with wafer is moved to the alignment station.

315 — The wafer is aligned to alignment features on the cartridge bottom section.

320 — The cartridge bottom section, with wafer, is moved to the cartridge rack, which contains cartridge top sections, with probe cards.

325 — The cartridge bottom section is mated to a cartridge top section. Alignment pins or similar functioning mechanical alignment features on the cartridge top section mate with alignment features on the cartridge bottom section to guarantee accurate alignment between the contact pads on the wafer and the probes on the probe card.

330 — The wafer is electrically tested by automated test equipment which is connected to the cartridge through the backplane connector. Within the cartridge, the electrical signals are routed from the backplane connector to the probe card.

335 — Once testing is completed, the cartridge bottom section, with wafer, is disengaged from the cartridge top section, and is moved back to the FOUP load port.

340 — The wafer is transferred from the cartridge bottom section to the FOUP.

345 — The process is repeated for each wafer being tested. The automated test equipment is made up of multiple, independently operated test stations, where each test station is dedicated to a particular wafer cartridge slot in the handler. Therefore, the testing of multiple wafers can be done independently and simultaneously.

500 — Calibrate alignment of all bottom cartridge sections to all top cartridge sections in the test cell. This step is performed once for the test cell, and there is no need for recalibration unless the cartridge hardware is replaced. The calibration constants are stored for use during production test.

505 — Calibrate the alignment of the probe card to the top cartridge section. This step is done once for the test cell for each probe card and for each target slot, and needs to be repeated when the probe card is changed, but does not need to be changed for a new wafer. Each wafer is positioned, i.e. aligned, individually before actual, i.e., production, testing. The calibration constants obtained for each target slot and each probe card during this step are stored for later use during production test.

510 — Move a cartridge bottom section, with a wafer loaded thereon, to a target slot in the alignment station in the test cell.

515 — Recall the alignment calibration coefficients from steps 500 and 505 for the specific target slot and probe card.

520 — Perform an actual alignment of the wafer to the cartridge bottom section, using the stored calibration constants of step 515. Alignment techniques may include optical or mechanical techniques.

525 — Move the cartridge bottom section with the aligned wafer thereon, to a target lot, and engage with the cartridge top section. Mechanical alignment pins 435 guarantee that the cartridge top and bottom sections will be properly aligned to one another.

Single-Chuck Prober:

Single Wafer in Cartridge-Based Multi-Wafer Cell:

Two Wafers Interleaved in Cartridge-Based Multi-Wafer Cell:

Effective Timing of Test vs. Overhead with Two Wafers Interleaved:

One time per cartridge
when test cell is started

FIG. 9

METHOD AND APPARATUS FOR MASSIVELY PARALLEL MULTI-WAFER TEST

FIELD OF THE INVENTION

This invention relates to semiconductor device testing, and in particular to multi-wafer testing of semiconductor devices.

BACKGROUND

Wafer-level Test and Burn-in (WLTBI) refers to the process of subjecting semiconductor devices to electrical testing and burn-in while they are still in wafer form. Burn-in is a temperature/bias reliability stress test used in detecting and screening out potential early life failures.

Test equipment for burn-in and other testing of electrical circuits generally comprise a connection arrangement for electrically connecting an electrical circuit to be tested, such as an integrated circuit on a wafer or test substrate, to a test probe circuit.

WLTBI usually employs a wafer prober to supply the necessary electrical excitation to all the die on the wafer through hundreds or thousands of ultrathin probing needles (mounted on a probe card) that land on the bond pads, balls, or bumps on the die. The wafer is generally placed on a chuck plate, and the probe card must be properly aligned to the wafer.

To maximize throughput and minimize per-wafer testing costs, multi-wafer testing has emerged as an important technique. This generally involves the loading of multiple wafers into cartridges for alignment or for transport to the testing station. Two current approaches in use for multi-wafer test are:

1. Multi-chuck probers: Standard wafer probers are modified to contain multiple chucks. The chucks share a common loading mechanism but operate independently during alignment and test. In general, the loading mechanisms may be largely automated and utilize Front Opening Unified Pods (FOUP's), which are described in http://en.wikipedia.org/wiki/FOUP. An issue with this method is that multi-chuck probers require that each stage contains all of the necessary optical, electrical, and mechanical hardware to perform the fine alignment of the wafer to the probe card, resulting in substantial added cost to the overall test cell due to the duplication of hardware. Further, current multi-chuck probers scale in the horizontal dimension, taking up additional floor space for each added wafer.

2. Manual-insertion Cartridge-based Test Cell: Wafers are loaded into cartridges and aligned at a separate alignment station located on the test floor. The alignment of the probe card to the wafer is done at the alignment station after the cartridge is assembled into a single unit. This alignment is done by moving the probe card relative to the fixed wafer. Operators move the cartridges from the alignment station to the test cell and insert them into the testing rack. Each cartridge includes a connector that is mated to a corresponding connector in the testing rack, providing electrical contact between the wafer and the automated test equipment (ATE) system. The automated test equipment may be made up of multiple, independently operated test stations, where each test station is dedicated to a particular wafer cartridge slot in the handler. Therefore, the testing of multiple wafers can be done independently and simultaneously. The ATE system may be a stacked modular BIST tester, wherein a dedicated tester module is connected to each cartridge. The devices on the wafer are tested by running a test program on the ATE equipment which provides a variety of stimuli to the devices and measures and records the results. The cartridges are manually removed after testing is complete. The wafers can then be unloaded or left in the cartridges for additional test insertions. Manual insertion cartridge-based test cells are described in U.S. Pat. No. 6,340,895, "Wafer-level burn-in and test cartridge", Frank Otto Uher et al, and in U.S. Pat. No. 6,580,283, "Wafer level burn-in and test methods", Mark Charles Carbone et al.

In the art, the stacked modular tester and stacked cartridge configuration has generally been utilized for burn in testing.

There are several key disadvantages to this prior manual insertion cartridge based test cell approach. The cartridge must be designed to allow the probe card to move, thereby adding cost and complexity. The entire cartridge must be moved from the alignment station to the location where it connects to the test system, increasing the size and weight of the object that must be moved either manually or robotically. This design requires a contactor between the cartridge and test system that undergoes repeated insertions. Each time a new wafer is inserted the cartridge must be moved to the alignment station and then back to the testing location, requiring a cycling of the contactor. This adds cost to the contactor both from the need for a durable contactor and the need to periodically replace the contactor when its lifetime cycling specification is reached.

A multi-wafer test system that conserves horizontal floor space, is cost effective and efficient would be an important development.

SUMMARY OF THE INVENTION

Disclosed herein is a cost effective, efficient, massively parallel (i.e., able to test all devices on multiple wafers simultaneously) multi-wafer test cell. Additionally, this test cell can be used for both single-touchdown and multiple-touchdown applications. In a single-touchdown application, all integrated circuits on the wafer are contacted simultaneously by the probe card. In a multiple-touchdown application, the probe card contacts a subset of the integrated circuits on the wafer during each touchdown, and must be moved (generally by a fixed amount) between touchdowns. The process is repeated until all integrated circuits on the wafer have been contacted. The invention uses a novel "split-cartridge" design, combined with a method for aligning wafers when they are separated from the probe card assembly, to create a cost effective, efficient multi-wafer test cell. A "probe-card stops" design may be used within the cartridge to simplify the overall cartridge design and operation.

BRIEF DESCRIPTION OF THE DRAWINGS

FIG. 6b illustrates a side view pre-contact of the embodiment of FIG. 6a.

FIG. 6c illustrates a side view post-contact of the embodiment of FIG. 6a.

DETAILED DESCRIPTION

Prior use of stacked cartridge racks has been for burn in. These prior uses have utilized manual loading rather than FOUP automation, with the associated disadvantages as described earlier. In contrast, some prior testing situations are automated but are not configured to be massively parallel. This invention combines a high degree of automation with the ability for massively parallel testing.

Figure 1:
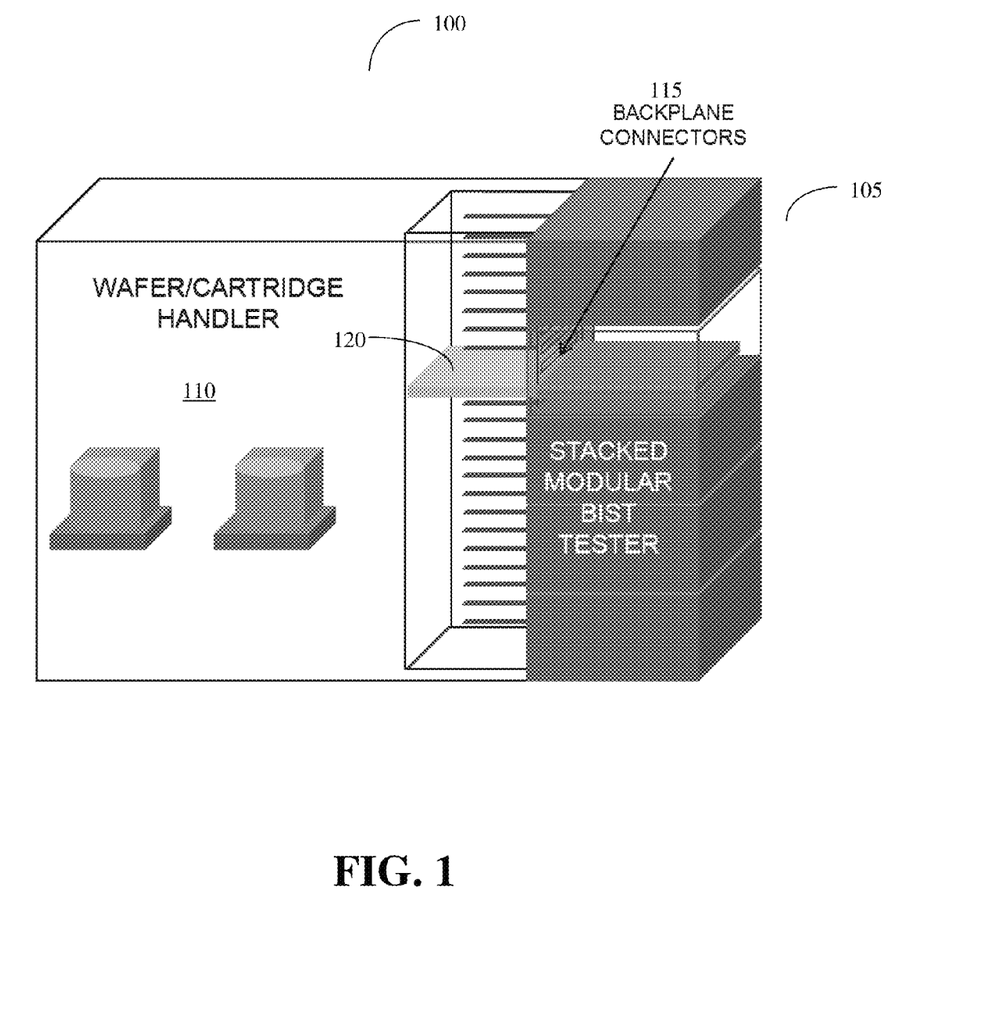
FIG. 1 is a block diagram of the elements of a test cell including the inventive wafer cartridge handler.

FIG. 1 is a block diagram showing high level elements of a test cell for testing integrated circuits, including the inventive wafer cartridge handler as described hereinafter. The test cell 100 includes the automated test equipment 105, a wafer cartridge handler 110, and a shared, two-sided backplane 115 that serves as an interface between the test equipment 105 and the wafer cartridges 120. The automated test equipment is a set of computer-controlled electronic hardware which provides stimuli to the individual devices on the wafers and measures and records results. These stimuli and results are typically in the form of voltages or currents that are applied or measured at specific times during the test. The wafer cartridge handler is capable of accepting one or more FOUP's (Front Opening Unified Pods) containing wafers which are loaded into wafer cartridges, aligned with the electrical probes within the cartridges, then docked to the shared backplane to electrically connect the devices on the wafer to the automated test equipment.

The inventive system uses a novel "split-cartridge" design, combined with a method for aligning wafers when they are separated from the probe card assembly, to create a cost effective, efficient, multi-wafer test cell. A "probe-card stops" design can be used within the cartridge to simplify the overall cartridge design and operation.

Figure 2:
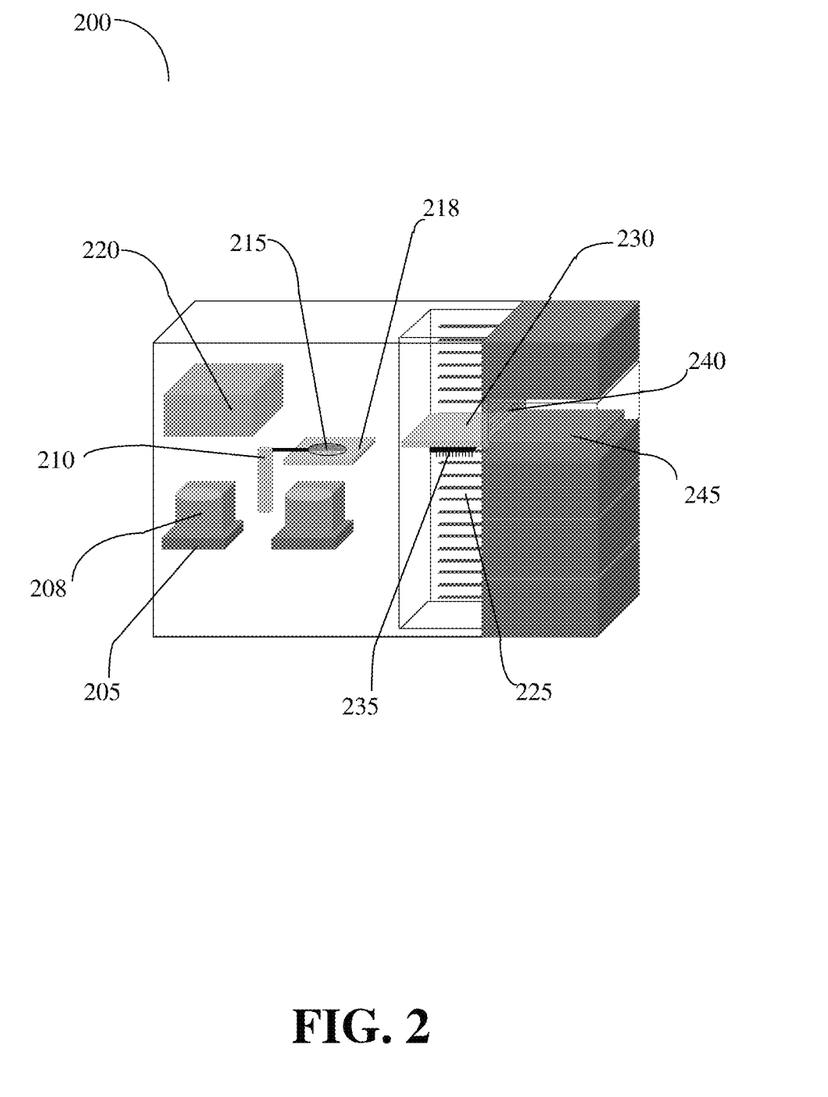
FIG. 2 is a block diagram of the elements of an embodiment of the inventive wafer cartridge handler.

FIG. 2 is a block diagram of the elements of an embodiment of an inventive wafer handler, utilized in the test cell as described above. Wafer cartridge handler 200 includes load ports 205 into which one or more FOUP's 208 (Front Opening Unified Pods) are inserted. Robotics 210 are configured to remove a wafer 215 from a FOUP and place it on cartridge bottom section 218 for alignment, which occurs at alignment station 220. Cartridge rack 225 contains cartridge top sections 230 with probe cards 235. Back plane connector 240 connects cartridges to ATE 245.

Figure 3:
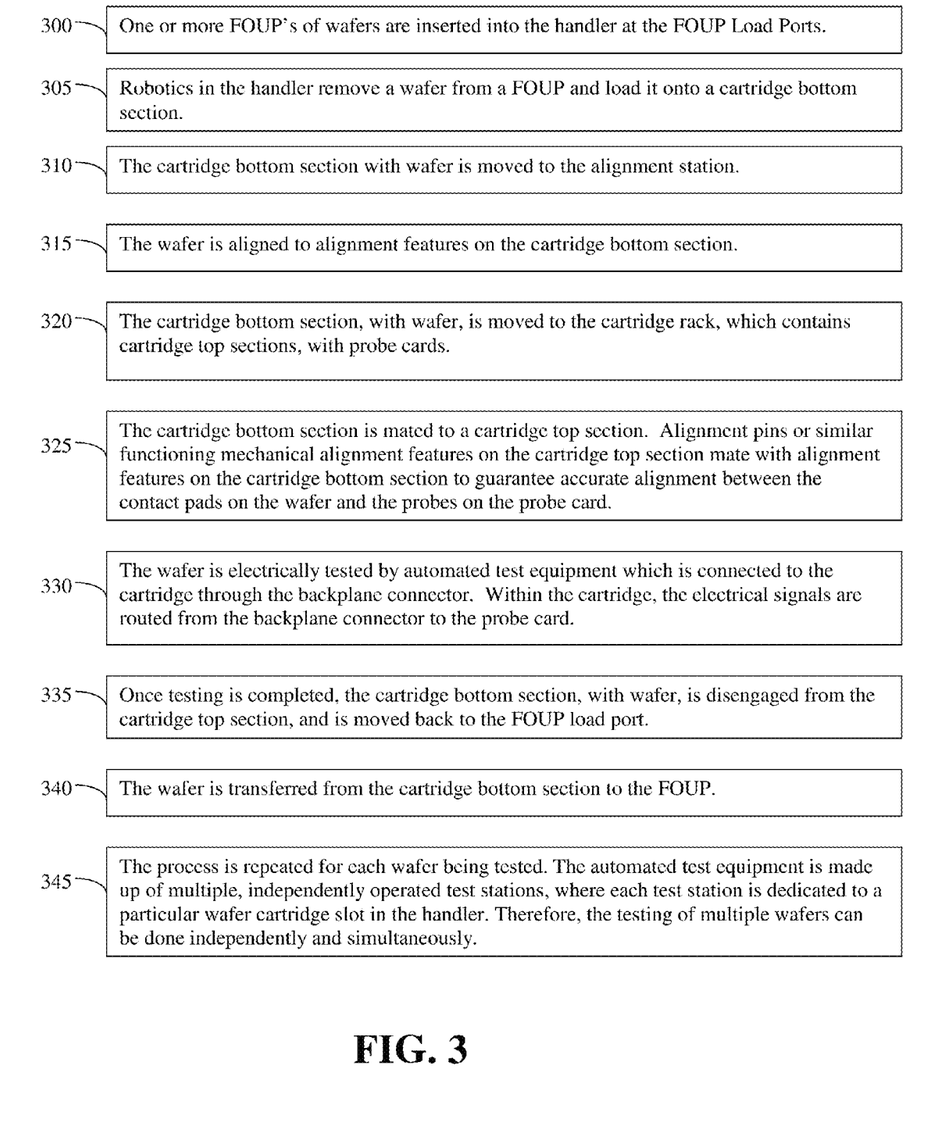
FIG. 3 is a flow diagram of an embodiment of typical operation of the wafer cartridge handler during production test.

FIG. 3 is a flow diagram of an embodiment of typical operation of the wafer cartridge handler during production test.

In step 300, one or more FOUP's of wafers are inserted into the handler at the FOUP Load Ports.

In step 305, robotics in the handler remove a wafer from a FOUP and load it onto a cartridge bottom section.

In step 310, the cartridge bottom section with wafer is moved to the alignment station.

In step 315, the wafer is aligned to alignment features on the cartridge bottom section.

In step 320, the cartridge bottom section, with wafer, is moved to the cartridge rack, which contains cartridge top sections, with probe cards.

In step 325, the cartridge bottom section is mated to a cartridge top section. Alignment pins or similar functioning mechanical alignment features on the cartridge top section mate with alignment features on the cartridge bottom section to guarantee accurate alignment between the contact pads on the wafer and the probes on the probe card.

In step 330, the wafer is electrically tested by automated test equipment which is connected to the cartridge through the backplane connector. Within the cartridge, the electrical signals are routed from the backplane connector to the probe card.

In step 335, once testing is completed, the cartridge bottom section, with wafer, is disengaged from the cartridge top section, and is moved back to the FOUP load port.

In step 340, the wafer is transferred from the cartridge bottom section to the FOUP.

In step 345, the process is repeated for each wafer being tested. The automated test equipment is made up of multiple, independently operated test stations, where each test station is dedicated to a particular wafer cartridge slot in the handler. Therefore, the testing of multiple wafers can be done independently and simultaneously.

The innovative cartridge design allows the cartridge top section (which is connected to the ATE via the backplane connector), to stay in place in the cartridge rack except for when it needs to be serviced or the probe card needs to be changed. This design substantially decreases the cycling of the backplane connectors, reducing cost and increasing lifetime. The alignment pins mechanically guarantee alignment of the cartridge sections in the cartridge rack without requiring the use of optical alignment equipment in the cartridge rack. The size and weight of the wafer carrier is substantially reduced by only moving the cartridge bottom section around the handler with the wafer.

Because the Probe Card stays in the Cartridge Rack with the Cartridge Top Section, connected to the automated test equipment, it can be used to test one wafer while another wafer is being aligned. This process is known as "interleaving". This is accomplished by having multiple Cartridge Bottom Sections paired to each Cartridge Top Section. While one wafer is being tested, the next wafer is aligned and moved, on a Cartridge Bottom Section, to a staging area by the Cartridge Rack. As soon as testing of the first wafer is completed, the Cartridge Bottom Section, with wafer, is disengaged from the Cartridge Top Section, and the Cartridge Bottom Section, with wafer, in the staging area is swapped into the Cartridge Rack and engaged with the Cartridge Top Section. As a result, the alignment time for each wafer is "hidden" during production test, since it is done in parallel with the testing of the previous wafer. This shortens the overall time required to test a FOUP filled with wafers, increasing test throughput.

Figure 4:
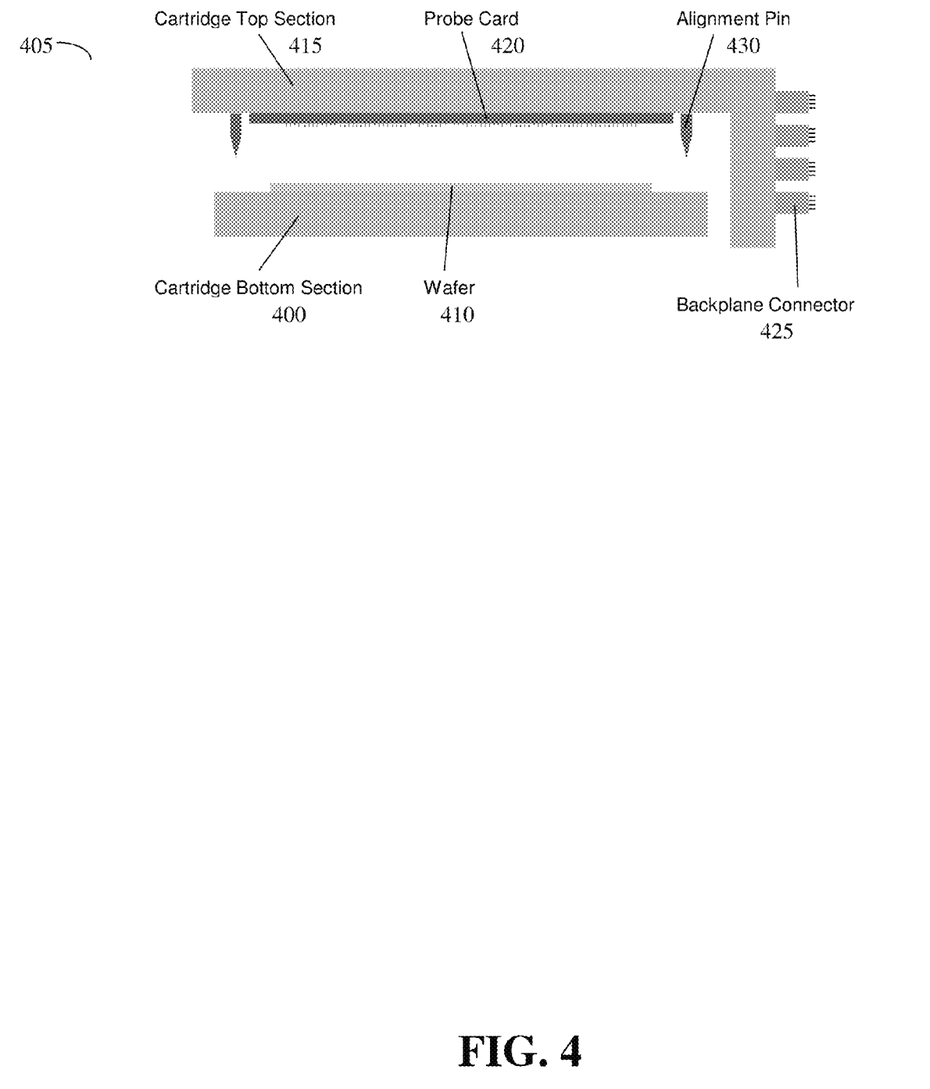
FIG. 4 is an illustration of the innovative split-cartridge design.

FIG. 4 is an illustration of an embodiment of the innovative split-cartridge design. In this design, the bottom section 400 of the cartridge 405 functions as a carrier for the wafer 410, and is designed to move the wafer around to different areas of the Wafer Cartridge Handler. Cartridge top section 415 with probe card 420 aligned and mounted thereon, includes backplane connector 425 for connection to the ATE (shown in FIG. 2). Mechanical alignment pins 430 facilitate alignment of cartridge bottom section 400 to cartridge top section 415.

Figure 5A:
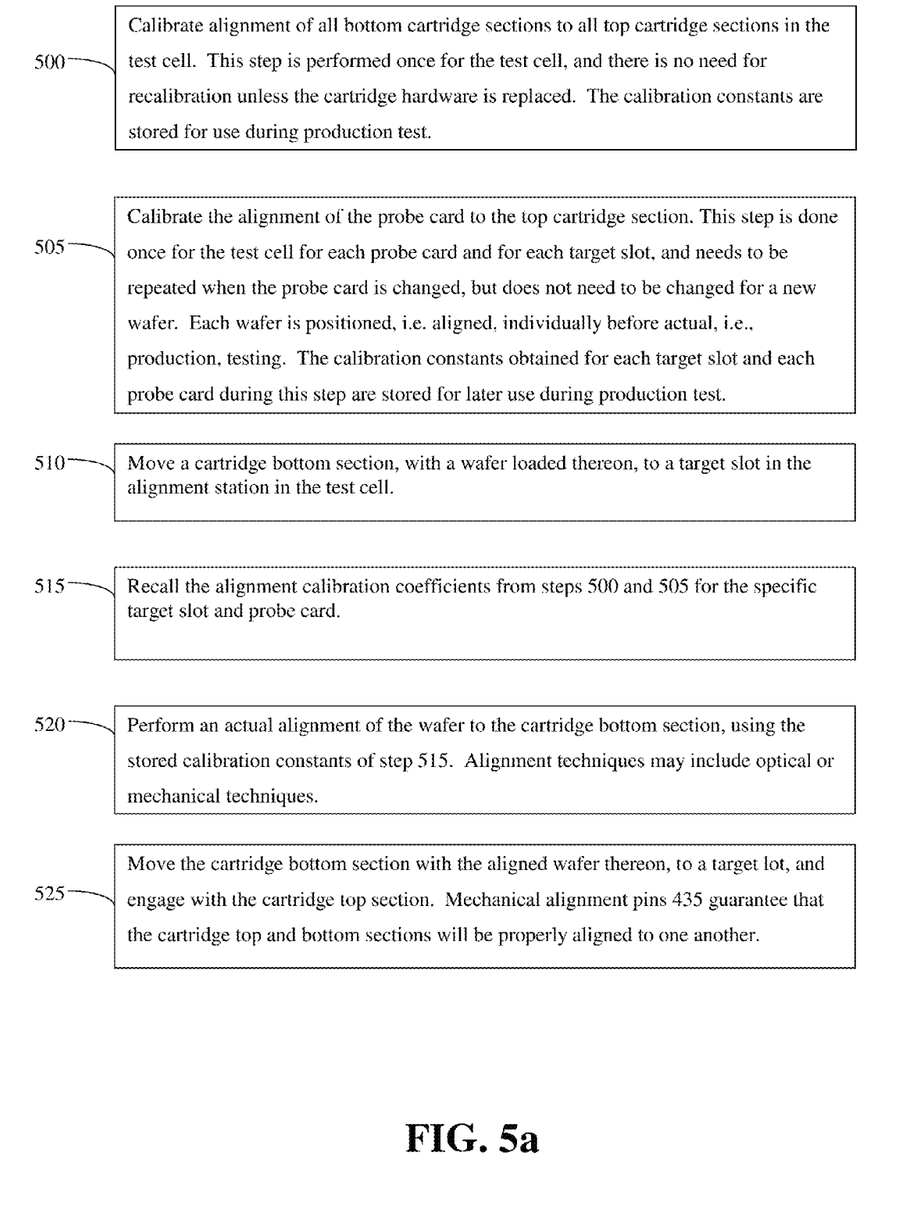
FIG. 5a is a flow diagram of an embodiment of alignment of the wafer to the probe card, without requiring the probe card to be present in the alignment station.

FIG. 5a is a flow diagram of an embodiment of alignment of the wafer to the probe card, without requiring the probe card to be present in the alignment station. In order to enable this, alignment calibration is performed prior to production test, with the actual alignment occurring during production test.

Steps 500 and 505, the alignment calibration, are performed prior to production test, and steps 510-525, the actual alignment, are performed during production test.

In step 500, calibrate alignment of all bottom cartridge sections to all top cartridge sections in the test cell. This step is performed once for the test cell, and there is no need for recalibration unless the cartridge hardware is replaced. The calibration constants are stored for use during production test.

In step 505, calibrate the alignment of the probe card to the top cartridge section. This step is done once for the test cell for each probe card and for each target slot, and needs to be repeated when the probe card is changed, but does not need to be changed for a new wafer. Each wafer is positioned, i.e. aligned, individually before actual, i.e., production, testing. The calibration constants obtained for each target slot and each probe card during this step are stored for later use during production test.

In step 510, move a cartridge bottom section, with a wafer loaded thereon, to a target slot in the alignment station in the test cell.

In step 515, recall the alignment calibration constants from step 500 and 505 for the specific target slot and probe card.

In step 520, perform an actual alignment of the wafer to the cartridge bottom section, using the stored calibration constants of step 515. Alignment techniques may include optical or mechanical techniques. In step 525, move the cartridge bottom section with the aligned wafer thereon, to a target slot, and engage with the cartridge top section. Mechanical alignment pins 435 guarantee that the cartridge top and bottom sections will be properly aligned to one another.

Figure 5B:
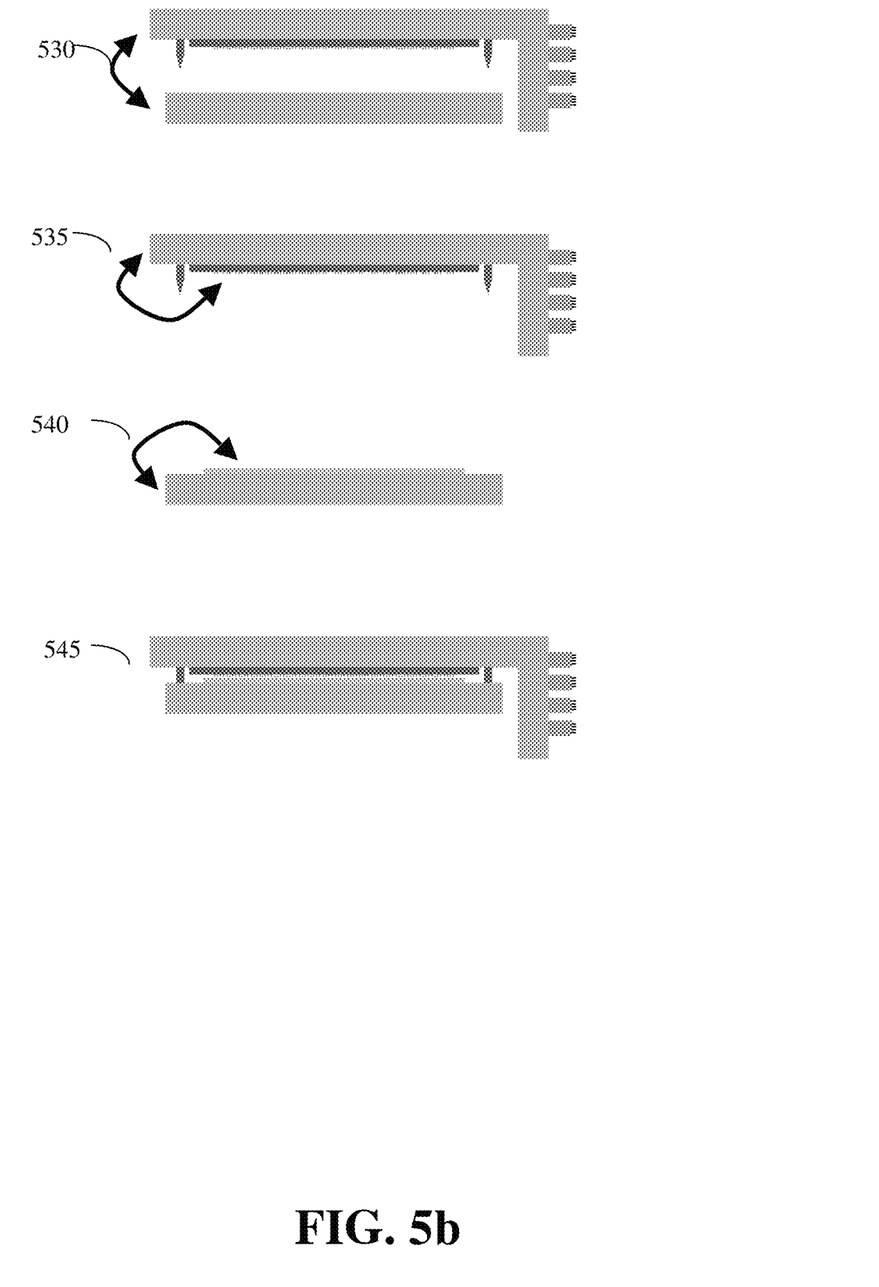
FIG. 5b illustrates an embodiment of a probe card alignment calibration.

FIG. 5b visually illustrates the alignment of probe card, wafer, and cartridge. Step 530 shows alignment of cartridge bottom section 400 to cartridge top section 415. Step 535 shows alignment of probe card 420 to cartridge top section 415. Step 540 shows alignment of wafer 410 to cartridge bottom section 400. Step 545 shows engaging cartridge bottom section 400 to cartridge top section 415, using mechanical alignment pins 435.

The alignment procedure outlined above aligns the contact pads on the wafer to the probes on the prove card without requiring the probe card to be present in the optical alignment station during production test. This indirect alignment is advantageous as follows: If direct alignment was done during production, one would need to either 1. have a separate optical alignment station for each cartridge, or 2. Would need to remove the probe card from the backplane connector in order to use a central alignment station. This would increase wear and associated costs for the backplane connector. The current method allows for use of a central alignment station but maintains the minimum wear and cost of backplane connectors. This indirect alignment is made possible by "pre-aligning" both the cartridge bottom section and the probe card to the cartridge top section before production test, and storing the alignment calibration constants for later used during production test. When the wafer is aligned to the cartridge bottom section, the stored calibration constants for the specific cartridge sections and probe card are recalled and used as offsets during the alignment process, such that the wafer will be accurately aligned to the probe card when the cartridge bottom section and cartridge top section are mated.

Figure 6A:
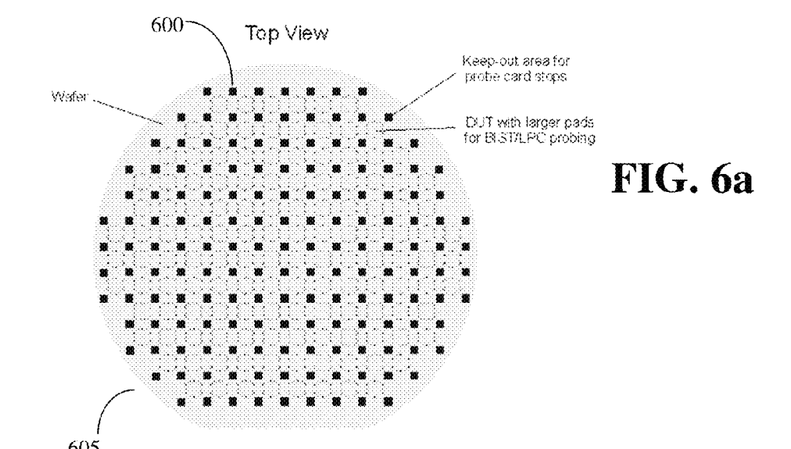
FIG. 6a illustrates a top view of a first embodiment of an innovative distributed stops design for the probe card.
Figure 6B:
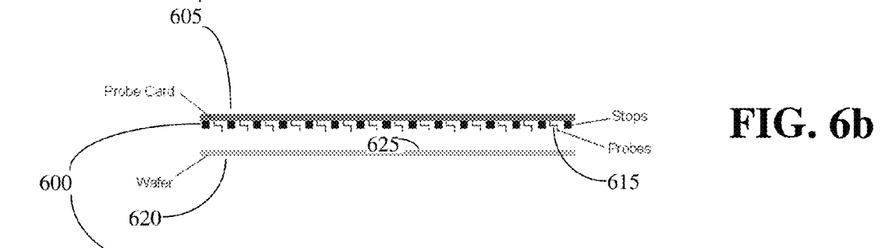
Figure 6C:
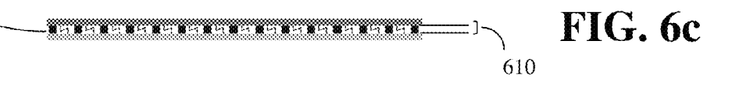

In order to accurately control the amount of z-travel required to vertically position the probe card and wafer such that the probes are properly contacting the pads on the wafer, an innovative distributed stops design for the probe card has been developed. A first embodiment of the inventive distributed stops design is illustrated in FIG. 6a-6c. FIG. 6a is a top view, FIG. 6b is a side view pre-contact, and FIG. 6c is a side view post-contact. Rigid stops 600 are distributed fairly evenly throughout the surface of probe card 605, and are fabricated to a height 610 that allows probes 615 to contact pads on wafer 620, and compress a specific amount before stops 600 contact surface 625 of wafer 620, and prevent further compression. This design removes the requirement for a precision Z-travel mechanism in the cartridge. The mechanism must mainly be designed to provide sufficient force to compress the probes to the stop height 610, while taking care not to provide too much additional force, which could result in damage to the wafer. An advantage to the distributed stops approach is that the compression force can be provided either with mechanical force or with a vacuum. If vacuum were used without the distributed stops, the wafer would most likely flex further towards the probe card in the center of the wafer, causing uneven contact or damage to the probe card or wafer. In contrast, if the distributed stops were not used, mechanical compression force with a sufficiently rigid mechanical body would be required to avoid this problem.

Figure 7:
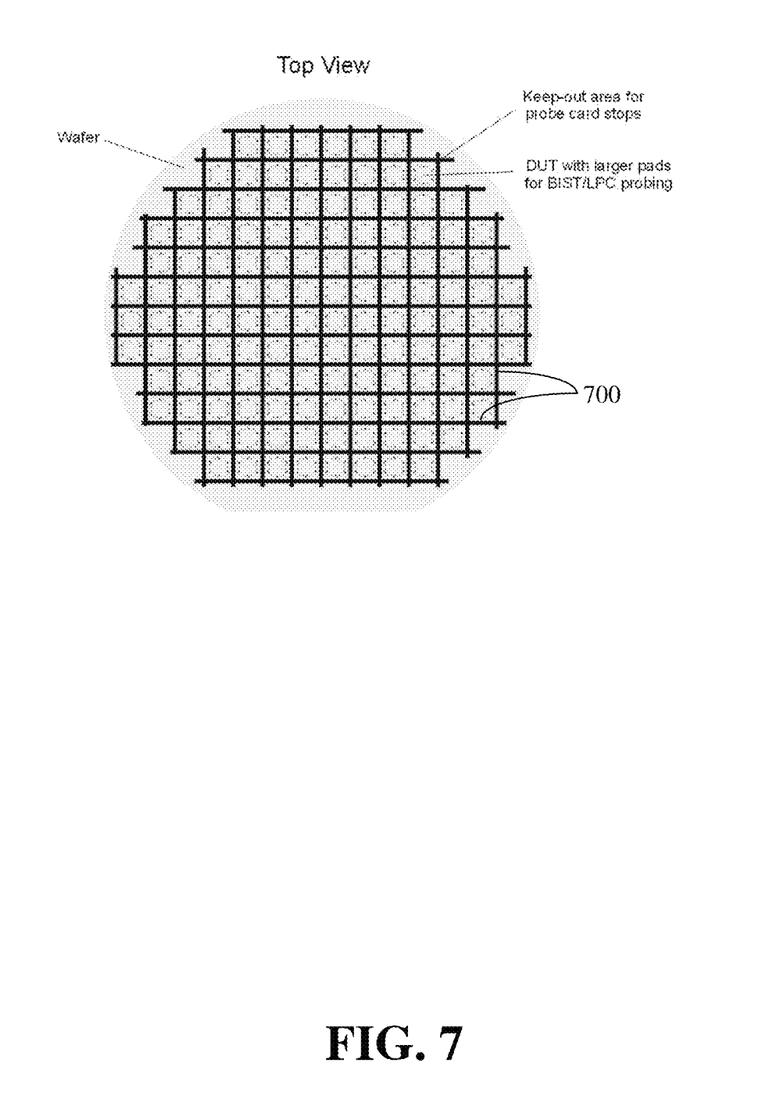
FIG. 7 illustrates a second embodiment of an innovative distributed stops design for the probe card.

FIG. 7 is a top view of a second embodiment of the inventive distributed stops design. In this embodiment lines 700 of stops, the X and Y axes dimensions of the probe card, form a window screen design. This could allow the use of narrower stops while still providing the necessary force distribution, due to the increased surface area of a line as compared with discrete points, as in the first embodiment. In a sub-embodiment, the stops could be implemented as lines in the X or Y axis dimension only.

A prior method for using stops to limit over-travel in a probe card assembly is disclosed in U.S. Pat. No. 7,084,650 by Cooper et al. In this patent the stops for limiting over-travel of the probe card relative to the wafer are located on the periphery of the probe card only. With this design there is no localized distribution of force throughout the probe card and wafer surfaces, resulting in the following issues:
  a) Concentrated force in a small area of the wafer could cause cracks or other types of physical damage.
  b) Imperfections in the planarity of the wafer or of the probe card could result in substantial variations in the amount of probe travel across the wafer, especially if the probe were further away from the periphery where the stops are located.
  c) Unless pressure on both the wafer and the probe card are sufficiently distributed, distortion, e.g. flexion, of one or both will occur when pressure is applied, resulting in substantial variations in the amount of probe travel across the wafer, especially if the probe were further away from the periphery where the stops are located.
  d) Vacuum cannot be used to hold the wafer and probe card together, as it can create deflection of the wafer and probe card, resulting in substantial deviations in the amount of probe travel across the wafer when contact is made, especially for the probes further away from the periphery where the stops are located.

U.S. Pat. No. 7,046,022 by Richmond et al bypasses probe cards by using an interposer for connecting the contact pads on the wafer to the corresponding electrical lines on the interface to the test equipment. This method is problematic because interposers are not able to achieve the same level of fine pitch probing that modern probe card technologies such as MEMS (Micro ElectroMechanical systems) are able to achieve. Also, with an interposer there are two repeatedly cycling contacts, one on each side of the interposer, per electrical line. This can result in higher overall contact resistance, signal degradation, and lower contactor reliability and lifetime.

Note that, whereas stops on the probe card are not a requirement for use of the innovative cartridge design or test method disclosed herein, however if a stops design such as those disclosed is not used, an alternative means of precision Z-travel control would be required.

The invention supports multiple-touchdown testing, where a subset of devices on the wafer is contacted by the probe card during each touchdown, and the probe card is shifted relative to the wafer for subsequent touchdowns until all devices have been contacted. In the invention, multiple-touchdown testing is accomplished by using multiple cartridges, where the probe card in each cartridge is positioned differently relative to the wafer. The wafer is then cycled through all of the cartridges to complete the testing off all of the devices on the wafer.

In an embodiment of multiple-touchdown testing, one slot in the cartridge rack is dedicated to each touchdown. For example, for 4 touchdowns, a wafer will cycle through 4 cartridges. The same probecard is used in each cartridge, but its position is fixed for a specific touchdown. In an alternate embodiment, though not anticipated to be preferred, a dedicated probe card could be used for each touchdown. Currently multiple touchdown testing is achieved by using a wafer prober that has indexing capability, meaning that it can repeatedly lift the probes off the wafer, move the wafer by a defined amount in the X-Y direction, and lower the probes back down to contact the next set of devices to be tested. In the invention, multiple touchdown testing is achieved by shifting the position of the probecard in each successive cartridge by the same defined amount in the X-Y direction versus the position of the probecard in the previous cartridge. For each touchdown, the wafer is loaded into a new cartridge and aligned at a central alignment station, and then the aligned wafer and cartridge are loaded into the test rack. Interleaving of wafers is used to completely hide all setup and alignment overhead, leaving the time required to remove a cartridge bottom section from the cartridge rack and insert the next cartridge bottom section as the only effective overhead per touchdown.

Figure 8:
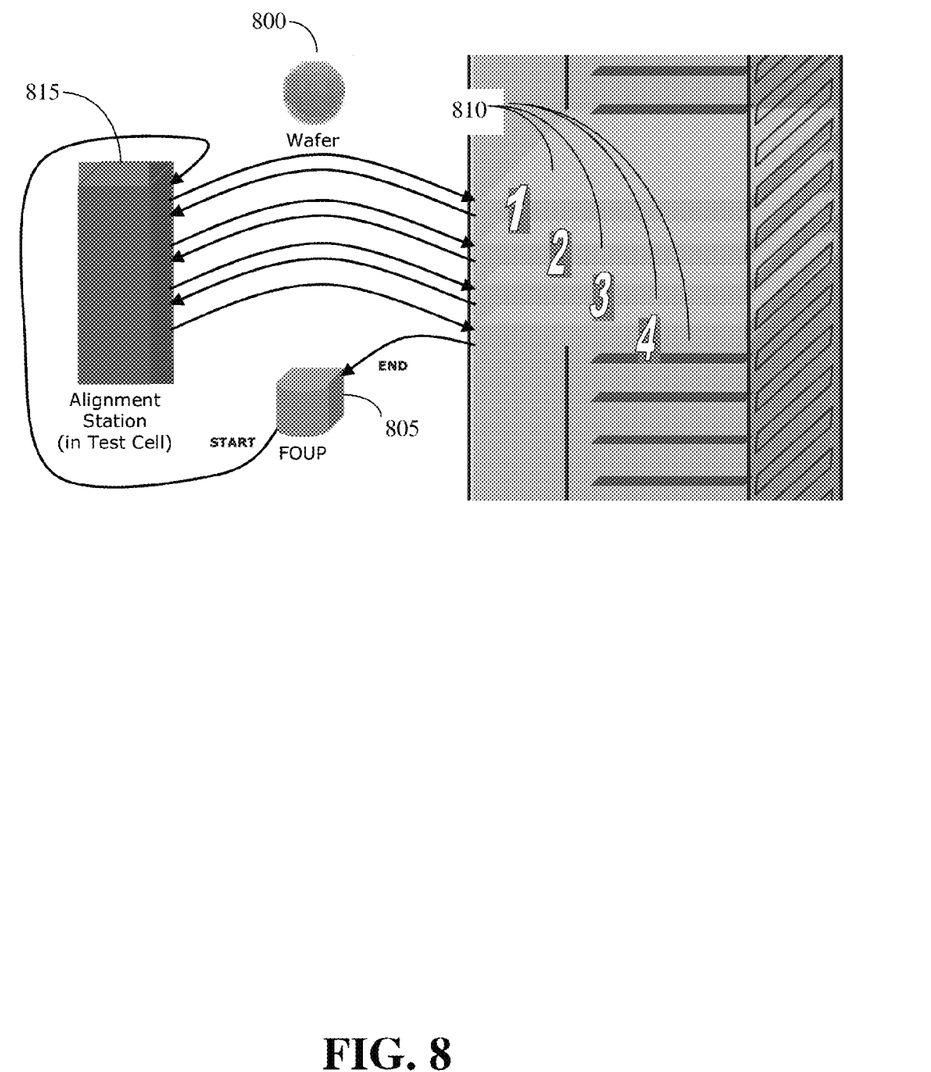
FIG. 8 illustrates a multiple-touchdown testing process.

The multiple-touchdown testing process is illustrated in FIG. 8, where a wafer 800 requiring four touchdowns is removed from the FOUP 805 and sequentially loaded into four different cartridges 810, where a subset of the devices is tested in each cartridge. Alignment must be performed at alignment station 815 each time the wafer is moved to a new cartridge. Once testing has completed in the fourth cartridge, the wafer is returned to the FOUP.

Figure 9:
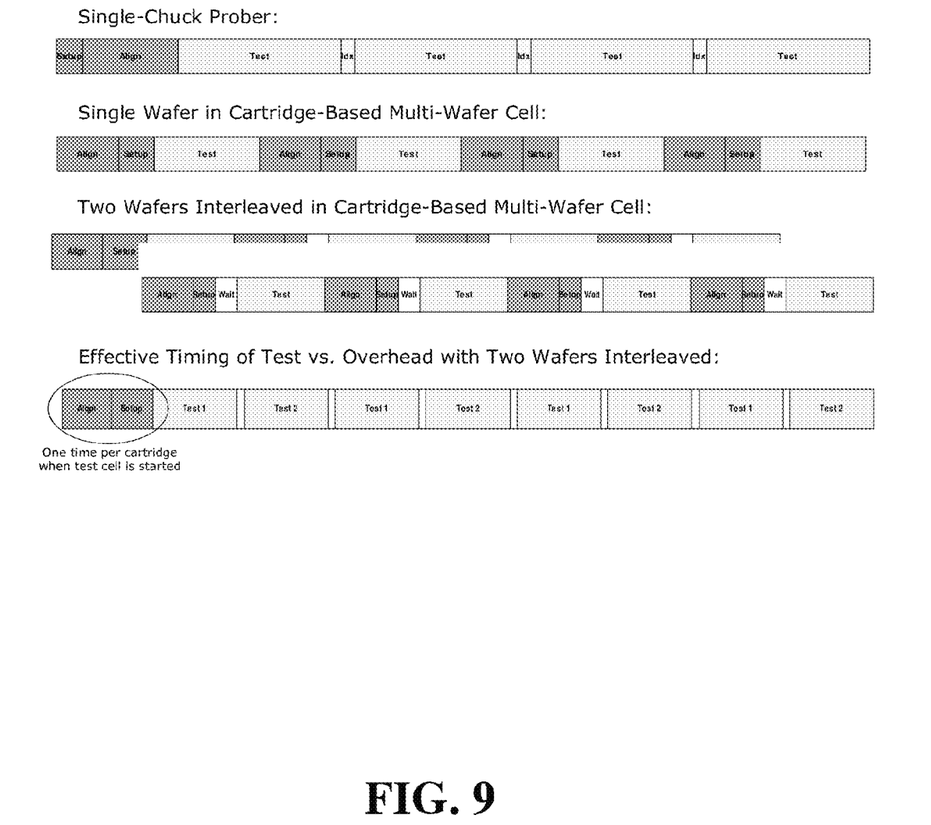
FIG. 9 shows a comparison of the timing of operations in a standard single-chuck wafer prober versus the cartridge-based multi-wafer test-cell described in this invention.

FIG. 9 illustrates a comparison of the timing of operations in a standard single-chuck wafer prober versus the cartridge-based multi-wafer test-cell described in this invention.

With a single-chuck prober, after setup and alignment are complete, the first subset of devices on the wafer is contacted and tested. The wafer is then indexed to the next position, and the next subset of devices on the wafer is contacted. This is repeated until all devices have been contacted and tested.

In the cartridge-based multi-wafer test cell described in this invention, since the wafer must be moved to a new cartridge for each touchdown, alignment and setup operations must be repeated for each touchdown and test. However, as shown in FIG. 9, this overhead can be hidden by interleaving multiple wafers, such that when one wafer is being tested, the other wafer is going through its alignment and setup operations. This reduces the effective overhead to equal the time it takes to remove a cartridge bottom section and wafer from the cartridge rack and replace it with the cartridge bottom section containing the next wafer.

The ability of the invention to support both single-touchdown and multiple-touchdown testing increases its flexibility for use in a high-volume manufacturing environment. In this environment the goal is to utilize the test equipment as efficiently as possible to test the range of devices that the manufacturer produces. Depending on their characteristics and specifications, certain devices may require multiple touchdowns. If test equipment has limitations that prevent it from testing certain devices or reduce the test throughput on those devices, additional test capacity may need to be purchased, increasing the overall test cost for the manufacturer.

It is not expected that the invention be restricted to the exact embodiments disclosed herein. Those skilled in the art will recognize that changes and modifications can be made without departing from the inventive concept. For example, other configurations of distributed stops can be used than those disclosed. The scope of the invention should be construed in view of the claims.

The invention claimed is:

1. A system comprising:
   a cartridge rack including a plurality of slots;
   a plurality of cartridge top sections, wherein each cartridge top section is docked in a respective slot of said cartridge rack;
   a plurality of probe cards, wherein each probe card is mounted to a respective cartridge top section;
   a plurality of cartridge bottom sections; and
   a wafer cartridge handler,
      to determine, before production testing, a first set of alignment constants for each pair of cartridge bottom sections and cartridge top sections, and a second set of alignment constants for each probe card and respective cartridge top section,
      to load, during production testing, each of a plurality of wafers into a given cartridge bottom section,
      to align, during production testing, each wafer in said respective given cartridge bottom section based upon said first set of alignment constants and said second set of alignment constants for the respective cartridge bottom section paired to a particular cartridge top section and respective probe card; and
      to move, during production testing, said respective cartridge bottom section with loaded and aligned wafer to said cartridge rack and mate said respective cartridge bottom section to said particular paired cartridge top section, wherein mechanical alignment features on said cartridge top section mates with mechanical alignment features on said cartridge bottom section.

2. The system of claim 1, configured to support multiple touchdown testing, wherein a separate target slot in said cartridge rack is dedicated to each touchdown.

3. The test cell of claim 1, wherein said wafer cartridge handler is configured to accept one or more Front Opening Unified Pods (FOUPS) containing said wafers which are loaded into said cartridge bottom sections.

4. The system of claim 1, including:
   automated test equipment; and
   a backplane acting as an interface between said automated test equipment and said cartridge top sections.

5. The system of claim 4, wherein said automated test equipment is a set of computer-controlled electronic hardware which provides stimuli to devices on said wafers and measures and records results.

6. The system of claim 4, wherein said wafer cartridge handler includes:
   load ports into which a front opening unified pod (FOUP) is inserted;
   robotics configured to remove a wafer from said FOUP and mount it on a given cartridge bottom section for alignment; said cartridge rack an alignment station where alignment of said each wafer in said respective cartridge bottom section occurs.

7. The system of claim 6, wherein said alignment station is configured to utilize optical alignment.

8. The system of claim 6, wherein said alignment station is configured to utilize mechanical alignment.

9. The system of claim 1, configured to enable testing of at least one of said plurality of wafers while at least one other of said plurality of wafers is being aligned.

10. The system of claim 1, wherein said probe cards include rigid stops distributed approximately evenly throughout said probe card, said rigid stops designed to accurately control z-travel required to vertically position the probe card and wafer such that probes on said probe card are properly contacting pads on the wafer.

11. The system of claim 10, wherein said rigid stops are fabricated to a height that allows said probes to contact said pads and to compress a user-determined amount before said rigid stops contact said wafer and prevent further compression.

12. The system of claim 11, wherein said rigid stops are arranged in a two dimensional array pattern.

13. The system of claim 11, wherein said rigid stops are arranged in a pattern of lines in the X or Y axis.

* * * * *